United States Patent
Chen et al.

(10) Patent No.: US 7,317,203 B2
(45) Date of Patent: Jan. 8, 2008

(54) METHOD AND MONITOR STRUCTURE FOR DETECTING AND LOCATING IC WIRING DEFECTS

(75) Inventors: Wen-Yi Chen, Zhubei (TW); Jun-Yean Chiu, Jhudong Township, Hsinchu County (TW); Chung Lee, Hsinchu (TW); Hung-Hon Lui, Hsin-chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 141 days.

(21) Appl. No.: 11/189,180

(22) Filed: Jul. 25, 2005

(65) Prior Publication Data

US 2007/0020778 A1  Jan. 25, 2007

(51) Int. Cl.
*H01L 23/58* (2006.01)
*H01L 21/66* (2006.01)

(52) U.S. Cl. .............. 257/48; 257/115; 257/123; 257/E21.521; 257/E21.524; 438/14; 438/17; 438/18

(58) Field of Classification Search .......... 257/48, 257/115, 123, 208; 438/11–14, 18
See application file for complete search history.

(56) References Cited

U.S. PATENT DOCUMENTS

| | | | | |
|---|---|---|---|---|
| 5,757,079 | A  * | 5/1998 | McAllister et al. | 257/776 |
| 2005/0139767 | A1* | 6/2005 | Pinto et al. | 250/307 |
| 2006/0088949 | A1* | 4/2006 | Smayling et al. | 438/14 |

* cited by examiner

*Primary Examiner*—Dung A. Le
(74) *Attorney, Agent, or Firm*—Tung & Associates

(57) ABSTRACT

A 3-dimensional PCM structure and method for using the same for carrying out 3-dimensional integrated circuit wiring electrical testing and failure analysis in an integrated circuit manufacturing process, the method including forming a first metallization layer; carrying out a first wafer acceptance testing (WAT) process to test the electrical continuity of the first metallization layer; forming first metal vias on the first metallization layer conductive portions and a second metallization layer comprising metal islands on the first metal vias wherein the metal islands electrically communicate with the first metallization layer to form a process control monitor (PCM) structure; and, carrying out a second WAT process to test the electrical continuity of the first metallization layer.

20 Claims, 3 Drawing Sheets

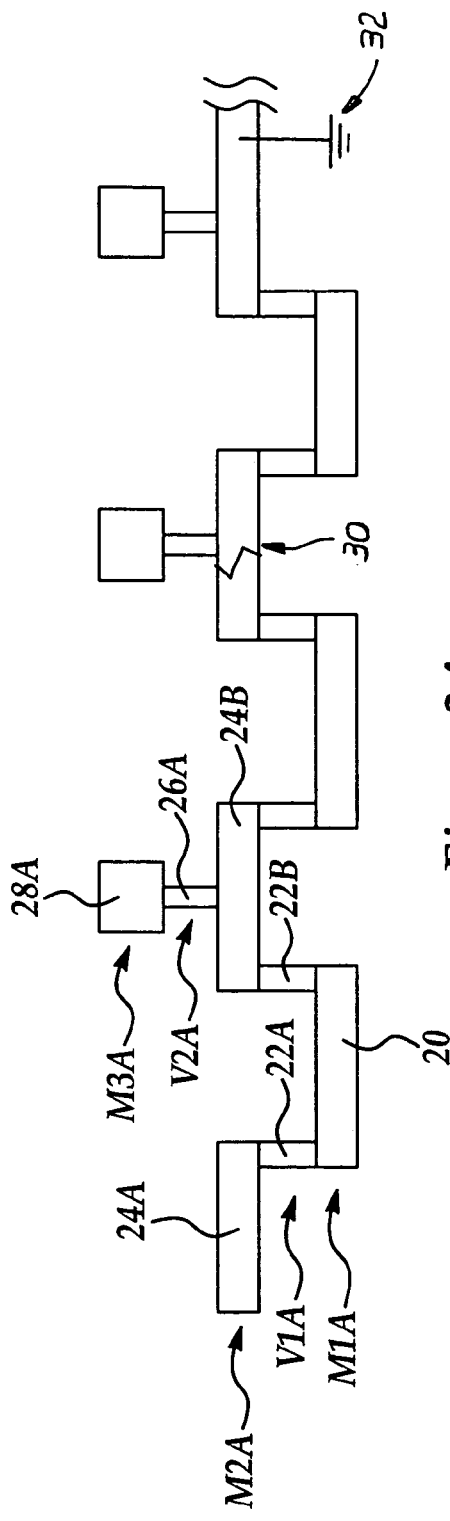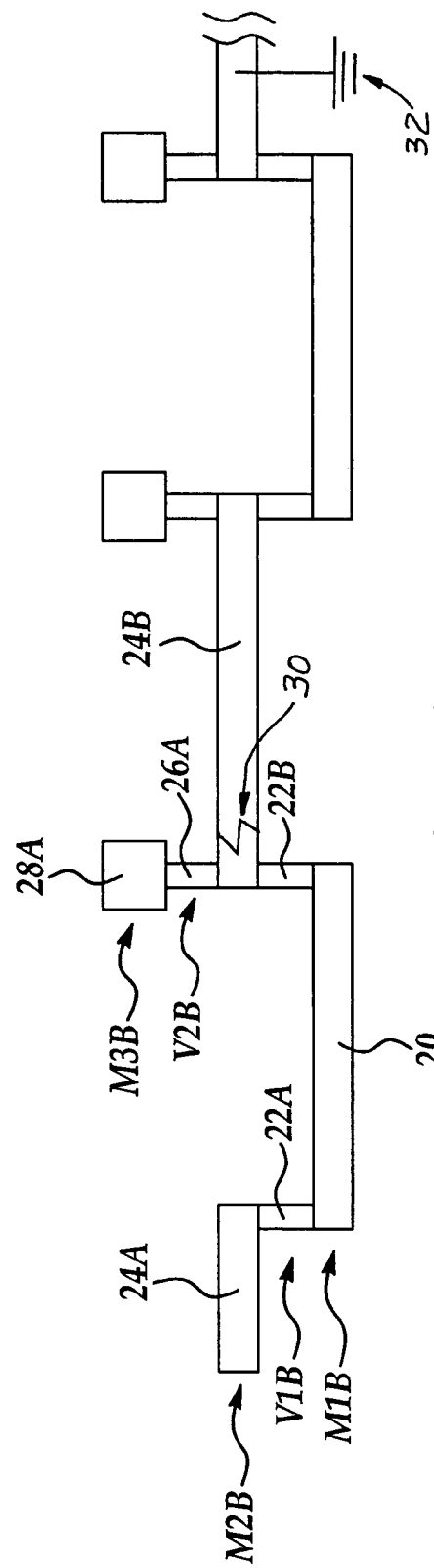

METHOD AND MONITOR STRUCTURE FOR DETECTING AND LOCATING IC WIRING DEFECTS

FIELD OF THE INVENTION

This invention generally relates to metrology methods in micro-integrated circuit manufacturing, and more particularly to an improved metrology method and process control monitoring (PCM) structure for determining and locating electrical continuity defects in integrated circuitry in an integrated circuit manufacturing process.

BACKGROUND OF THE INVENTION

Since the introduction of semiconductor devices, the size of semiconductor devices has been continuously shrinking, resulting in smaller semiconductor chip size and increased device density. One of the difficult factors in the continuing evolution toward smaller device size and higher density has been the ability to consistently form reliable integrated circuit wiring at smaller critical dimensions. For example, the reliability and electrical continuity of integrated circuitry wiring is determined by electrical continuity measurement methods following a manufacturing step, referred to as acceptance testing (WAT), to quickly determine and correct processing variables that may be causing circuitry defects.

Frequently, in order to determine processing variable that may lead to electrical continuity defects, it is desirable to form a test circuitry portion on a portion of the process wafer, referred to as a process control monitor (PCM), to determine the presence of defective circuitry portions. For example, the electrical integrity (continuity) of integrated circuitry is typically determined by passing an electrical signal through the process monitor control (PCM) circuitry.

One problem with prior art methods of electrical continuity WAT of PCM structures is that an uppermost metallization layer including a 2-dimensional circuit pattern is relied on for detecting circuitry defects in the most recently formed (uppermost) metallization layer. Frequently, testing of the most recently formed metallization layer is unable to detect the presence of defects in underlying metallization layers caused by formation of the most recently formed metallization layer.

For example, prior art metal continuity testing processes presently use 2-dimensional "snake shaped" metal line structures in testing of circuitry integrity in a metallization layer. If a circuitry defect is suspected in underlying metallization layers, frequently, the overlying layers must be removed to locate the defective area.

There is therefore a need in the semiconductor manufacturing art to develop an improved metrology method and integrated circuit monitoring structure to improve the identification and location of integrated circuit electrical continuity defects.

It is therefore an object of the invention to provide an improved metrology method and integrated circuit monitoring structure to improve the identification and location of integrated circuit electrical continuity defects, while overcoming other shortcomings of the prior art.

SUMMARY OF THE INVENTION

To achieve the foregoing and other objects, and in accordance with the purposes of the present invention, as embodied and broadly described herein, the present invention provides a 3-dimensional PCM structure and method for using the same for carrying out 3-dimensional integrated circuit wiring electrical testing and failure analysis in an integrated circuit manufacturing process.

IN a first embodiment, the method includes forming a first metallization layer; carrying out a first wafer acceptance testing (WAT) process to test the electrical continuity of the first metallization layer; forming first metal vias on the first metallization layer conductive portions and a second metallization layer comprising metal islands on the first metal vias wherein the metal islands electrically communicate with the first metallization layer to form a process control monitor (PCM) structure; and, carrying out a second WAT process to test the electrical continuity of the first metallization layer.

These and other embodiments, aspects and features of the invention will be better understood from a detailed description of the preferred embodiments of the invention which are further described below in conjunction with the accompanying Figures.

BRIEF DESCRIPTION OF THE DRAWINGS

FIGS. 2A and 2B are cross sectional views of PCM structures according to embodiments of the present invention.

DETAILED DESCRIPTION OF THE PREFERRED EMBODIMENTS

Although the method and apparatus of the present invention is explained and is particularly advantageous for determining the existence of and location of defects in copper or copper alloy metallization layers forming portions of a process control monitor for determining the reliability of an integrated circuit manufacturing process, it will be appreciated that other conductive materials including aluminum and tungsten may be used. Further although, the nature of underlying metallization layer metal interconnect defects are discussed with respect to via induced metal island corrosion (VIMIC) effects, it will be appreciated that the 3-dimensional metal interconnect process control monitor (PCM) structure including a method for detecting and locating metal interconnect defects may be applied, in general, to the detection and location of electrical continuity defects in underlying metallization layers.

Figure 1A:
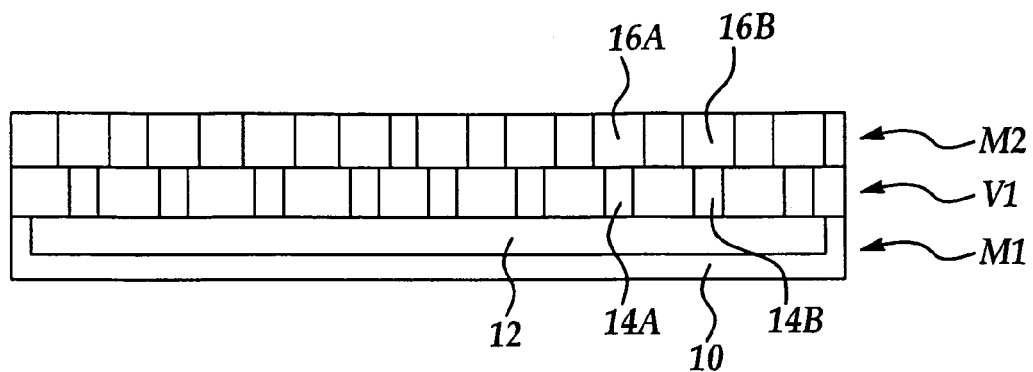
FIG. 1A is a cross sectional view of a PCM structure according to an embodiment of the present invention.

Referring to FIG. 1A is shown a cross sectional view of a portion of an exemplary interconnect layout comprising a portion of process control monitor structure (PCM). For example, the PCM interconnect layout may be formed separately or on a portion of the process wafer in parallel with the forming of a multi-level integrated circuit semiconductor device on active areas of the process wafer. For example, the PCM interconnect layout structure is first formed with a lower (first) metallization layer M1 including a damascene metal interconnect line portion 12, e.g., copper or copper alloy, formed in dielectric insulating layer 10. Conventional processes may be carried out to form metallization layer M1 including patterning, etching trench openings in the dielectric layer 10, forming barrier layers to line the openings, filling the openings with metal, and carrying out a planarization process, e.g., a CMP process, to planarize the metal filled damascene.

A first conventional electrical continuity parametric test, also referred to as electrical continuity wafer acceptance testing (WAT), is then undertaken to determine (test) the electrical continuity of metallization layer M1. For example, conventional automated electrical testing probe systems are used to probe the PCM structure for electrical continuity defects, e.g., by applying and detecting currents or Voltages through contact pads in communication with the first metallization layer, including a PCM interconnect line portion e.g., 12 forming a lengthened conductive line in snaked pattern on the surface of the metallization layer M1. For example, a 4-point or 2-point resistance measurements using conductive test pads in communication with the snaked line pattern may be used.

Following electrical continuity WAT of M1 metallization layer, in an important aspect of the present invention, an overlying metallization layer M2 is formed including via interconnect layer portions e.g., V1 which includes via portions e.g., 14A, 14B in electrical communication with upper metal island portions 16A and 16B. It will be appreciated that via interconnects, e.g., layer portion V1, and metallization layer M2, may be formed separately or by a dual damascene process in respective single or separate overlying dielectric insulating layers to form via portions e.g., 14A, 14B and metal island portions e.g., 16A and 16B.

Following planarization, e.g., chemical mechanical polishing (CMP) of the second metallization layer M2, a second WAT test is carried out to test for electrical continuity. In an important aspect of the invention, by adding the second metallization layer M2 including interlevel via portions to create a 3-dimensional interconnect layer layout for the PCM monitor, a second WAT test may now be undertaken and compared to the first WAT test according to the present invention, to detect via induced metal island corrosion (VIMIC) defects caused in metallization layer M1 by the formation process of metallization layer M2, for example VIMIC caused by formation of overlying via portions e.g., 14A and 14B.

For example, where the first WAT test is normal, e.g., detecting the absence of electrical opens in metallization layer M1, but where an abnormality is detected in the second WAT test after M2 formation (e.g., abnormally high electrical resistance), the result of the first WAT test is convoluted with, e.g., subtracted from, the second WAT test to verify the existence of the abnormality including providing information on a likely defect location.

Figure 1B:
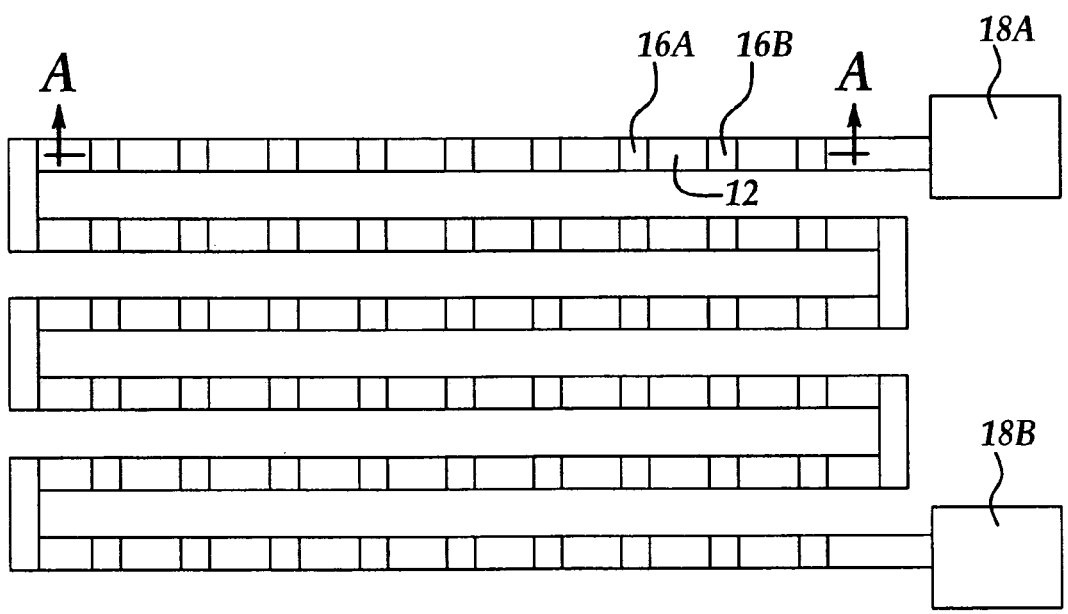
FIG. 1B is a top planar view of a PCM structure according to an embodiment of the present invention.

Referring to FIG. 1B is shown a top planar view showing a portion of an exemplary PCM interconnect layer structure for WAT according to an embodiment of the present invention. Shown are M2 metal island portions and portions of underlying metallization layer M1 interconnect test line portion 12. Line A-A indicates a cross-section of FIG. 1B corresponding to FIG. 1A. Additionally shown in FIG. 1B are contact pads 18A and 18B for applying electrical signals in a WAT test. Metallization layer M1 including metal interconnect line, e.g., 12, forms a continuous serpentine metal interconnect electrical pathway between contact pads 18A and 18B, which are formed in the uppermost metallization e.g., M2, and electrically communicate with metal interconnect line 12 through vias (not shown) underlying the contact pads 18A and 18B.

It will be appreciated that the relative widths and lengths of interconnect lines 12 and metal island portions e.g., 16A and 16B (including underlying via portions) may vary. For example, the M1 interconnect line 12 linewidth may be relatively wider or narrower, more preferably about the same width or wider with respect to metal island portions line widths e.g., 16A and 16B. In addition, the metal island portion lengths may be formed with a predetermined length and density e.g., where the spacing between metal island portions e.g., 16A and 16B may be varied depending on the desired PCM structure to test for the VIMIC effect. For example, advantageously, the VIMIC defects may be amplified by varying one or more of a relative density, line width, and line length of metal island portions e.g., 16A and 16B including underlying vias, in order to isolate a particular processing variable and enable easier identification of the VIMIC defect causing process variable.

Advantageously, by producing a 3-dimensional PCM interconnect layout structure including via portions in an uppermost metallization layer e.g., M2, the PCM structure can be used to determine electrical continuity failures in an underlying metallization layer, e.g., M1 following an overlying via and metallization layer formation process. For example, it has been found that overlying metallization layer formation processes including via formation can induce corrosion or erosion of underlying metallization layer portions, particularly when the respective metallization layer and vias are filled with copper. As noted above, such defects are also referred to as VIMIC defects. Although the precise mechanism of VIMIC defect formation is not understood, various processes including via etching, electro-chemical deposition (ECD), and chemical mechanical polish (CMP) processes are believed to contribute to such defects. The 3-dimension PCM structures of the present invention, advantageously allow the ability to detect such defects in underlying metallization layers without the necessity of removing the overlying metallization layers to expose the defective portion.

Referring to FIGS. 2A and 2B are shown exemplary embodiments for forming a 3-dimensional PCM via chain structure, to enable improved monitoring of processing effects of overlying metallization layer formation on underlying metallization layers including detection of VIMIC defects.

For simplicity, only the metal islands and via portions are shown, but it will be appreciated that the metal island and via portions may be, and preferably are, formed as damascene structures in dielectric insulating layers. For example, shown in FIG. 2A is lower (first) metallization level e.g., M1A including metal island portions e.g., 20. Via portions e.g., 22A, 22B are formed in via level V1A and electrically interconnect metal island portions e.g., 20 and metal island portions 24A and 24B formed in metallization level M2A. According to an aspect of the invention, additional Via portions e.g., 26A are formed in via level V2A together with overlying metal islands e.g., 28A in metallization level M3A. For example, the above 3-dimensional PCM structure is referred to as a via chain layout, e.g., including more than one via level and associated overlying metal island portions. It will be appreciated, as in the first embodiment, that the linewidth, line length, and density of the metal island portions including associated via portions may be varied to enable improved determination of the VIMIC defect producing process variable.

FIG. 2B shows alternative arrangements for the first metallization levels e.g., M1B, M2B, and M3B as well as via levels V1B and V2B. For example one or more vias in via levels V1B and V2B may electrically communicate e.g., contact a metal island portion in an underlying or overlying metallization layers, e.g., M1B, M2B, and M3B. For example, as shown, metal island portions e.g., 20, 24A, and 24B may be lengthened to change the relative density of overlying vias and associated metal island portions.

In exemplary operation, a first WAT process for electrical continuity is carried out following a planarization, e.g., CMP process of metallization level e.g., M2A, M2B. Assuming a normal result, i.e., no electrical discontinuities, according to an aspect of the invention, an overlying metallization level e.g., M3A, M3B with associated via level e.g., V2A, V2B is formed and a second WAT process is carried out similar to the first WAT test. The second WAT results are then compared with, e.g., subtracted from the first second WAT test to determine the existence of an electrical discontinuity or defect e.g., VIMIC defect in metallization layer M2A.

Assuming an abnormal WAT results, e.g., an open circuit, a post failure analysis (PFA) process is then undertaken to more accurately determine the location and nature of the defect. For example, a charge inducing energy source, preferably an ion-beam source, is used to induce a Voltage and/or current in the PCM structure, also referred to as ion-beam induced Voltage Contrast (VC) imaging. The induced Voltage and/or current may then be amplified and imaged by known methods where the brightness level of the image corresponds to the level of Voltage and/or current in the PCM structure. For example, the location of a defective portion in the PCM structure in the post failure analysis (PFA) step is determined by locating an interface of contrasting levels of brightness in an image which corresponds to the location of an electrical discontinuity portion (e.g., VIMIC defect) in the PCM circuitry. Advantageously, current from underlying metallization layers is conducted to the upper surface to enable location and visualization of defects in underlying layers without requiring removal of overlying layers.

For example referring again to FIGS. 2A and 2B, metallization layer M2A is shown connected to ground, e.g., 32, and VIMIC defect portions are shown at 30 in metal island portions of metallization layer M2A. Advantageously, contrasting levels of brightness and darkness at the VIMIC defective area 30 enable the precise location of the defective area according to the 3-dimensional PCM structure of the present invention. Moreover, by selecting the various dimensions including length and linewidths of metal islands in e.g., M1B, M2B and M3B, the PCM image contrast sensitivity may be improved to better indicate electrical discontinuities, e.g., VIMIC defects.

Figure 3:
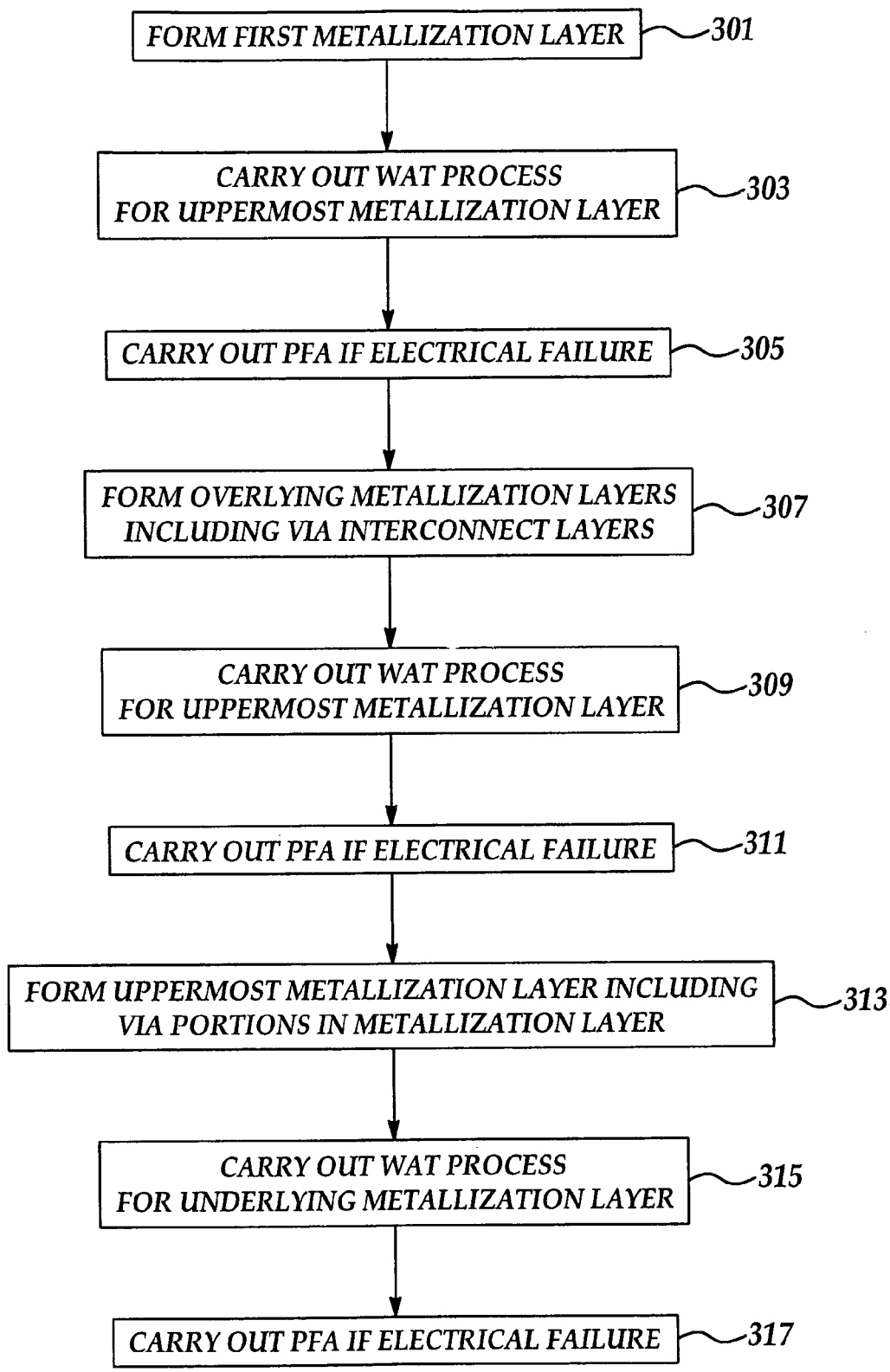
FIG. 3 is a process flow diagram including several embodiments for forming and using the PCM structure in an electrical continuity detection and locating process according to embodiments of the present invention.

Referring to FIG. 3, is shown a process flow diagram including several embodiments of the present invention. In process 301, a first metallization layer is formed by conventional processes. In process 303, a first electrical WAT process to test electrical continuity of the first metallization layer is carried out. In process 305, a second metallization layer including metal islands with underlying vias connecting to the first metallization layer are formed. In process 307, a second electrical WAT process is then carried out on the second metallization layer in communication with the first metallization layer to detect electrical continuity defects in the first metallization layer including comparing (e.g., subtracting) the first electrical WAT results from the second electrical WAT results. In process 309, if an electrical discontinuity (e.g., VIMIC) from process 307 is indicated, a PFA process is carried out on the PCM structure according to preferred embodiments (e.g., ion beam Voltage contrast (VC) imaging) to locate the source of the electrical discontinuity (e.g., VIMIC). The process is then completed by following steps 311, 313, 315 and 317 as shown in FIG. 3.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A process control monitor (PCM) circuit structure for carrying out carrying out integrated circuit electrical continuity testing and failure analysis comprising:
    a first metallization layer;
    first metal vias disposed on the first metallization layer;
    a second metallization layer comprising metal islands disposed directly on and in contact with the first metal vias;
    wherein the second metallization layer further comprises contact pads adapted to electrically communicate with said metal islands through said first metallization layer, said metal islands adapted to indicate an electrical discontinuity in the first metallization layer.

2. The PCM of claim 1, wherein the first metallization layer comprises damascene structures selected from the group consisting of interconnect lines and metal islands.

3. The PCM of claim 1, wherein a via chain underlies the first metallization layer.

4. The PCM of claim 1, wherein a plurality of metal islands electrically communicate with a contiguous conductive portion of the first metallization layer.

5. The PCM of claim 1, wherein the first metallization layer comprises underlying second metal vias communicating with a third metallization layer underlying said first metallization layer.

6. The PCM of claim 5, wherein the first and third metallization layers comprise interconnect line damascene structures having relatively different dimensions selected from the group consisting of a linewidth and a length.

7. The PCM of claim 5, wherein the first and third metallization layer comprise interconnect line damascene structures having about the same dimensions selected from the group consisting of a linewidth and a length.

8. The PCM of claim 1, wherein the contact pads in electrical communication with the first metallization layer are adapted to apply an electrical continuity test signal in a integrated circuit electrical continuity test.

9. The PCM of claim 1, wherein the first and second metallization layers comprise a metal selected from the group consisting of copper, copper alloys, aluminum, and tungsten.

10. The PCM of claim 1, wherein the first metallization layer comprises a serpentine shaped line in electrical communication with said metal islands.

11. A process control monitor (PCM) circuit structure for carrying out carrying out integrated circuit electrical continuity testing and failure analysis comprising:
    at least a first metallization layer comprising interconnect line damascene structures;
    first metal vias disposed on the interconnect line damascene structures;
    a second metallization layer comprising metal islands disposed directly on and in contact with the first metal vias;
    wherein the second metallization layer comprises contact pads adapted to electrically, communicate with said metal islands through said interconnect line damascene structures, said metal islands adapted to indicate an electrical discontinuity in the interconnect line damascene structures.

12. The PCM of claim 11, wherein a via chain underlies the first metallization layer.

13. The PCM of claim 11, wherein a plurality of metal islands electrically communicate with a contiguous interconnect line of the at least a first metallization layer.

14. The PCM of claim 11, wherein the at least a first metallization layer comprises underlying second metal vias.

15. The PCM of claim 11, wherein the at least a first metallization layer comprises an underlying metallization layer comprising interconnect line damascene structures wherein the at least a first and the underlying metallization layer interconnect line damascene structures have relatively different dimensions selected from the group consisting of a linewidth and a length.

16. The PCM of claim 11, wherein the at least a first metallization layer comprises an underlying metallization layer comprising interconnect line damascene structures wherein the at least a first and the underlying metallization layer interconnect line damascene structures have about the same dimensions selected from the group consisting of a linewidth and a length.

17. The PCM of claim 11, wherein the contact pads in electrical communication with the interconnect line damascene structures are adapted to apply an electrical continuity test signal in a integrated circuit electrical continuity test.

18. The PCM of claim 11, wherein the interconnect line damascene structures comprise a serpentine shaped interconnect line electrically communicating with said metal islands.

19. A process control monitor (PCM) circuit structure for carrying out carrying out integrated circuit electrical continuity testing and failure analysis comprising:

at least a first metallization layer comprising a serpentine shaped interconnect line damascene structure;

first metal vias disposed on the serpentine shaped interconnect line;

a second metallization layer comprising metal islands disposed directly on and in contact with the first metal vias;

wherein the second metallization layer further comprises contact pads adapted to electrically communicate with said metal islands through said serpentine shaped interconnect line, said metal islands adapted to indicate an electrical discontinuity in the serpentine shaped interconnect line.

20. The PCM of claim 11, wherein the contact pads in electrical communication with serpentine shaped interconnect line are adapted to apply an electrical continuity test signal in a integrated circuit electrical continuity test.

* * * * *